(12) United States Patent
Classen (10) Patent No.: US 11,619,647 B2
(45) Date of Patent: Apr. 4, 2023

(54) MICROMECHANICAL SENSOR SYSTEM, METHOD FOR USING A MICROMECHANICAL SENSOR SYSTEM

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/236,662

(22) Filed: Apr. 21, 2021

(65) Prior Publication Data
US 2021/0341510 A1 Nov. 4, 2021

(30) Foreign Application Priority Data
May 4, 2020 (DE) ................. 102020205616.1

(51) Int. Cl.
*G01P 15/00* (2006.01)
*G01P 15/125* (2006.01)
*G01P 15/08* (2006.01)

(52) U.S. Cl.
CPC ................. *G01P 15/0802* (2013.01)

(58) Field of Classification Search
CPC ..... G01P 2015/0871; G01P 2015/0874; G01P 15/00; G01P 15/08; G01P 15/0802; B81B 3/0013; B81B 3/0016; B81B 3/0051; B81C 1/00968; B81C 1/00984
See application file for complete search history.

(56) References Cited

U.S. PATENT DOCUMENTS

| | | | | |
|---|---|---|---|---|
| 6,626,040 B1 * | 9/2003 | Pereira | ..................... | F42B 15/01 |
| | | | | 73/514.38 |
| 2003/0007720 A1 * | 1/2003 | Staple | ................... | B81B 3/0016 |
| | | | | 385/18 |
| 2014/0260613 A1 * | 9/2014 | Qiu | ..................... | G01C 19/5733 |
| | | | | 73/504.15 |
| 2018/0134543 A1 | 5/2018 | Kuang et al. | | |
| 2018/0252744 A1 * | 9/2018 | Kamada | .............. | G01P 15/0802 |
| 2019/0100426 A1 * | 4/2019 | Painter | .................. | B81B 3/0097 |
| 2019/0389722 A1 * | 12/2019 | Lehee | ..................... | B82B 1/006 |

FOREIGN PATENT DOCUMENTS

| | | |
|---|---|---|
| DE | 19539049 A1 | 4/1997 |
| DE | 19949605 A1 | 4/2001 |
| DE | 102008043753 A1 | 5/2010 |
| DE | 102012207939 A1 | 11/2013 |
| EP | 0244581 A1 | 11/1987 |
| EP | 0773443 A1 | 5/1997 |
| EP | 3111232 B1 | 1/2018 |
| WO | 2015128819 A1 | 9/2015 |

* cited by examiner

*Primary Examiner* — Nguyen Q. Ha
(74) *Attorney, Agent, or Firm* — Norton Rose Fulbright US LLP; Gerard Messina (57) ABSTRACT

A micromechanical sensor system, in particular, an acceleration sensor, including a substrate having a main extension plane, the sensor system including a first mass and a second mass. The first and second masses are each designed to be at least partially movable in a vertical direction, perpendicular to the main extension plane of the substrate. The first mass includes a stop structure, wherein the stop structure has an overlap with the second mass in the vertical direction.

10 Claims, 10 Drawing Sheets

FIG. 7d ns of MICROMECHANICAL SENSOR SYSTEM, METHOD FOR USING A MICROMECHANICAL SENSOR SYSTEM

CROSS REFERENCE

The present application claims the benefit under 35 U.S.C. § 119 of German Patent Application No. DE 102020205616.1 filed on May 4, 2020, which is expressly incorporated herein by reference in its entirety.

BACKGROUND INFORMATION

The present invention is directed to a micromechanical sensor system.

Such micromechanical sensor systems or microelectromechanical systems (MEMS) are generally conventional. They are manufactured in mass production, for example, for measuring accelerations and/or rotation rates for different applications in the automobile and consumer areas.

For example, so-called "rockers" or rocker structures are utilized as capacitive acceleration sensors with a detection direction perpendicular to the wafer plane (typically referred to as the z direction). The sensor principle of these rockers is based on a spring-mass system in which, in the simplest case, a movable asymmetrical seismic mass, together with two counter electrodes, forms two plate capacitors having capacitances C1 and C2. The seismic mass is connected to the base via at least one torsion spring (usually rather two torsion springs). Since the mass structures are different in size on the two sides of the torsion spring, the mass structure, during the action of a z acceleration, rotates relative to the torsion spring as the rotation axis. In this way, the distance of the electrodes on the side including the larger mass becomes smaller, and it becomes larger on the other side. The resulting capacitance change, which is typically differentially evaluated as C1-C2, is a measure of the acting acceleration. Such acceleration sensors are described, for example, in European Patent Nos. EP 0 244 581 and EP 0 773 443 B1.

An important trend in the refinement of micromechanical sensors is the increase in the mechanical robustness or overload protection. Innovative applications result in new installation positions, and thus also in novel load profiles with increasing robustness requirements for the sensors. It is possible, for example, that inertial sensors are mounted in the stylus of tablets, smart phones, or computers. While tablets or also smart phones are only occasionally exposed to hard shocks, it must be expected that this is the case very frequently in the case of a stylus.

In addition, the acceleration sensors must have a preferably small design to lower the manufacturing costs, in order to be able to position a preferably large number of chips on a wafer. When the sensor core surface is decreased, the masses and spring stiffnesses of the sensors must be reduced. However, this also results in a decrease of the spring restoring forces when the sensor bounces against a stop.

Both trends in combination, increasing shock loads, while simultaneously striving for miniaturization, result in a considerably increased risk of adhesion (stiction), in which the movable sensor mass remains adhered to a mechanical fixed stop as soon as the adhesion forces in the stop are greater than the restoring forces of the spring-mass system.

A so-called anti-stiction coating (ASC), often used to reduce the adhesion forces, is situated on the surface of the sensor after the sensor has been exposed. However, if a sensor strikes against a stop very often, the ASC may become damaged, so that the sensor ultimately shows an increased tendency toward adhesion.

Z acceleration sensors are available in the related art. German Patent Application No. DE 10 2008 043 753 A1 shows a sensor including a resilient stop, which is implemented in the same functional level as the seismic mass. European Patent No. EP 3 111 232 B1 shows a system in which the stop is able to act not only in one direction, but on both sides, i.e., both in the direction of the bottom electrodes and in the direction of the sensor cap. German Patent Application No. DE 10 2012 207 939 A1 shows a resilient stop, which is formed from a second thin functional layer beneath or above a thicker functional layer.

Even though resilient stops, with appropriate dimensioning, contribute to an effective increase in the restoring force, adhesion remains a considerable challenge for the quality of sensors and, in particular, also of z acceleration sensors.

SUMMARY

It is an object of the present invention to provide a micromechanical sensor system which has an increased overload protection, it being possible, in particular, to reduce an adhesion risk in a robust and efficient manner.

The micromechanical sensor system according to an example embodiment of the present invention may have the advantage over the related art that an advantageous robustness of the sensor with respect to overload events is made possible.

Advantageously, for example, the adhesion risk of z acceleration sensors may be reduced when dynamic loads occur (i.e., non-static accelerations).

Another advantage is that the implementation of the stop structure may preferably be implemented without new technological requirements with regard to existing MEMS production processes, so that no/almost no additional costs arise in the production.

It is furthermore advantageous that the design changes at the sensor required according to the present invention are comparatively minor, so that the static (offset, sensitivity) and dynamic properties (frequency, damping, . . . ) of the sensor do not significantly change. This also ensures a cost-efficient integration option in existing sensor configurations.

Furthermore, the stop structure according to an example embodiment of the present invention may have a compact design, so that only a negligible additional space requirement arises.

Accordingly, no/hardly any additional costs arise, in particular, in the case of sensor systems which include a first and a second seismic mass (dual cores) and have a corresponding performance.

According to an example embodiment of the present invention, the overlap of the stop structure with the second mass (in the vertical direction) may, in particular, be configured in such a way that an overlap is formed between the second mass and the stop structure in the case of an orthogonal projection of the first mass (including the stop structure) and of the second mass onto the main extension plane of the substrate. The stop structure is accordingly situated, as seen in a top view (onto the main extension plane), in such a way that it has an overlap or a partial overlap with the second mass.

According to an example embodiment of the present invention, it is in particular possible that the first and second masses are situated next to one another as individual cores of a sensor (in particular, of a z acceleration sensor and, example, each in a rocker or trampoline form). The first and second masses are able to move independently of one another within the normal measurement range, i.e., in particular, without contact. It is thus, in particular, possible that the first stop structure and the second mass are designed to be contactless and spaced apart from one another in the idle state of the sensor system.

The stop structure is preferably situated in such a way that during a strong deflection, i.e., in an overload case, the second mass may come in mechanical contact with the overlapping stop structure of the first mass and/or that the second mass may come in mechanical contact with the overlapping stop structure of the first mass after an overload case.

Advantageous embodiments of the present invention may be derived from the disclosure herein.

According to one specific embodiment of the present invention, it is possible that the overlap of the stop structure with the second mass in the vertical direction is formed in that the stop structure, in the vertical direction, is at least partially situated between the second mass and the substrate. The stop structure may, accordingly, extend in an area beneath the second mass, so that, in a top view, an overlap or a partial overlap of the stop structure with the second mass exists. In this way, adhesion may be particularly advantageously prevented.

According to one specific embodiment of the present invention, it is possible that the second mass includes a further stop structure, the further stop structure having a further overlap with the first mass in the vertical direction. The further overlap of the further stop structure with the first mass (in the vertical direction) may, in particular, be configured in such a way that a further overlap is formed between the first mass and the further stop structure in the case of an orthogonal projection of the first mass and of the second mass (including the further stop structure) onto the main extension plane of the substrate. The further stop structure is accordingly situated, as seen in a top view (onto the main extension plane), in such a way that it has a further overlap or partial overlap with the first mass. The two individual cores situated next to one another may accordingly move independently, i.e., without contact, within the normal measurement range. The sensor is preferably designed in such a way in the process that, during a strong deflection (in the overload case), at least one of the individual cores (i.e., the first or second mass) may come in mechanical contact with the overlapping stop of the other individual core (i.e., the stop structure or further stop structure). Accordingly, a particularly advantageous increase in the adhesion robustness may be achieved for both individual cores.

According to one specific embodiment of the present invention, accordingly a sensor system including further masses and corresponding stop structures is also possible.

According to one specific embodiment of the present invention, it is provided that the further overlap of the further stop structure with the first mass in the vertical direction is formed in that the further stop structure, in the vertical direction, is at least partially situated between the first mass and the substrate. The further stop structure may, accordingly, extend in an area beneath the first mass, so that, in a top view, a further overlap or partial overlap of the further stop structure with the first mass exists.

According to one specific embodiment of the present invention, it is provided that the sensor system is designed in such a way that a contact is formed between the stop structure and the second mass in an overload case of the sensor system, the sensor system preferably being designed in such a way that a contact is formed between the further stop structure and the first mass in the overload case of the sensor system. In this way, an advantageous increase in the adhesion robustness may be achieved for one mass or both masses.

According to one specific embodiment of the present invention, it is provided that the stop structure is designed to be resilient, the further stop structure preferably being designed to be resilient. The stop structure is, in particular, designed to be resilient relative to the first mass or resiliently connected to the first mass. The further stop structure is, in particular, designed to be resilient relative to the second mass or resiliently connected to the second mass. In this way, the adhesion probability may particularly advantageously be decreased. During collisions with the respective other sensor core, the resilient stop structure may furthermore also advantageously be saved from destruction in the case of a particularly thin embodiment of the particular stop structure.

According to one specific embodiment of the present invention, it is provided that the second mass includes a contact element, in particular a protrusion, the contact element being situated in such a way that, in and/or after an overload case of the sensor system, a contact between the first mass and the second mass is established via the contact element and the stop structure, the first mass preferably including a further contact element, in particular, a further protrusion, the further contact element being situated in such a way that, in and/or after an overload case of the sensor system, a contact between the first mass and the second mass is established via the further contact element and the further stop structure. In this way, the contact element may, for example, be designed as a protrusion, a bulge, or a knob on a bottom side of the second mass, and be situated above the stop structure of the first mass (and, in the idle state, be situated in a contactless manner and spaced apart from the stop structure of the first mass). A corresponding design is possible for the further contact element of the first mass and the further stop structure. In this way, the respective contact area may be set particularly precisely via the geometry of the respective stop structure and the geometry of the corresponding contact element.

According to one specific embodiment of the present invention, it is preferably possible that the stop structure is designed in one piece with the first mass or as part of the first mass. It is preferably possible that the further stop structure is designed in one piece with the second mass or as part of the second mass. This results in a particularly cost-effective and efficient manufacturing process. However, as an alternative, it is also possible that the stop structure is a separate structure which is connected to the first mass, and/or that the further stop structure is a separate structure which is connected to the second mass.

According to one specific embodiment of the present invention, another object of the present invention is a method for using a micromechanical sensor system for measuring a measuring variable, in particular, an acceleration sensor for measuring an acceleration.

According to one specific embodiment of the present invention, it is possible that a contact is formed between the stop structure and the second mass in an overload case of the sensor system, a contact preferably being formed between the further stop structure and the first mass in the overload case of the sensor system. As an alternative or in addition, it is possible that a contact is formed between the stop structure and the second mass after an overload case of the sensor system, a contact preferably being formed between the further stop structure and the first mass after the overload case of the sensor system.

According to one specific embodiment of the present invention, it is possible that, in an overload case of the sensor system, a contact is formed between the stop structure and the second mass before the second mass and/or the first mass come(s) in contact with a further structure of the sensor system, a contact preferably being formed between the further stop structure and the first mass before the first mass and/or the second mass comes in contact with a further structure of the sensor system in the overload case of the sensor system. Accordingly, the first and second masses may each move freely until a contact is established with the corresponding stop structure of the other mass. In this way, it is, in particular, possible in a particularly advantageous manner that, in an overload case, an initial contact of one of the masses is established with the stop structure of the respective other mass even before a contact occurs with a stopper of the substrate or a stopper of any further structure.

The advantages and embodiments which were already explained in connection with the micromechanical sensor system according to the present invention or a specific embodiment of the micromechanical sensor system may be used for the method for using a micromechanical sensor system.

Exemplary embodiments of the present invention are shown in the figures and are described in greater detail below.

DETAILED DESCRIPTION OF EXAMPLE EMBODIMENTS

Identical parts are denoted by the same reference numerals in the various figures and are therefore generally also cited or mentioned only once.

Figure 1A:
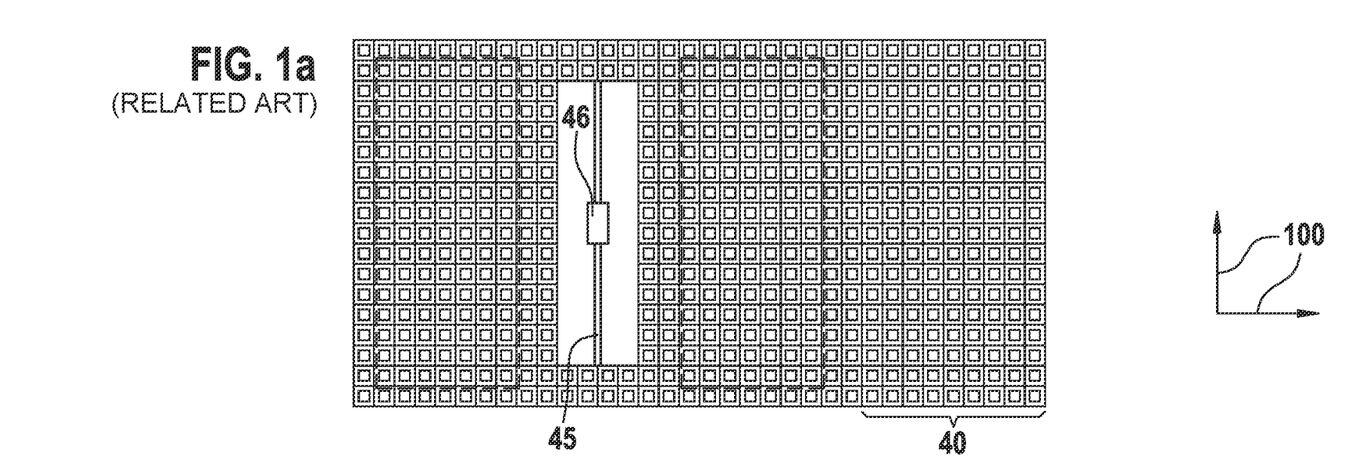
FIG. 1a, 1b, 2, 3, and 4 show schematic representations of sensors according to the related art.
Figure 1B:
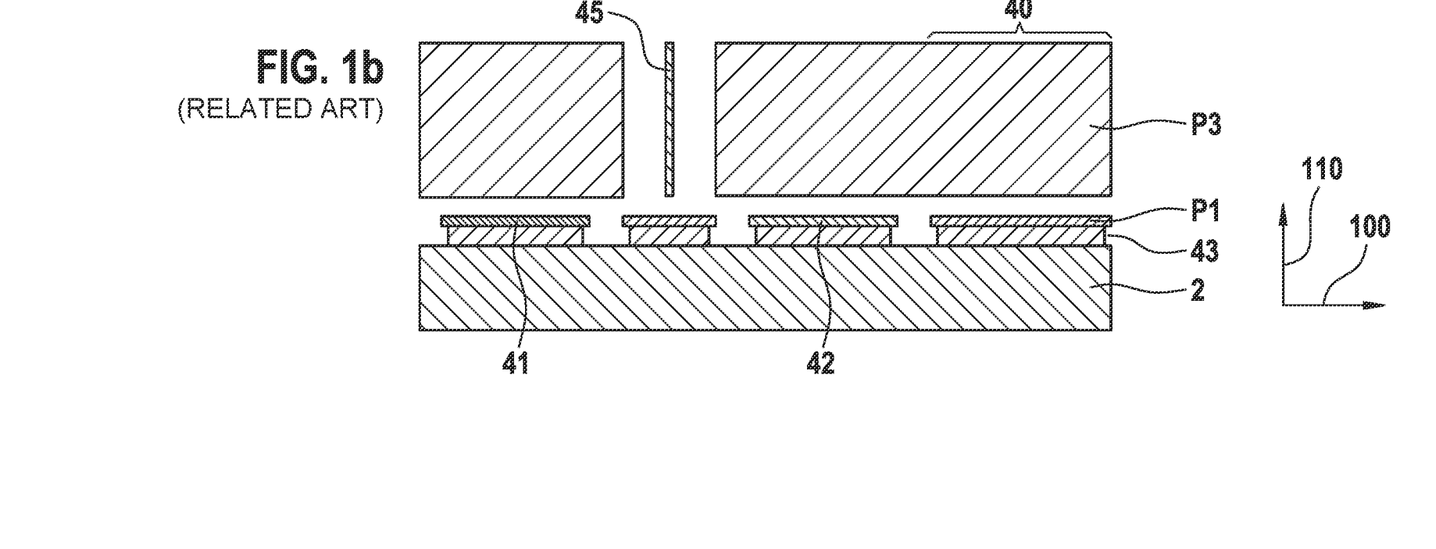

FIGS. 1a and 1b show a system of a capacitive acceleration sensor having a detection direction in a vertical direction 110 (z direction), perpendicular to main extension plane 100 of substrate 2, according to the related art. The sensor according to FIGS. 1a and 1b is designed as a "rocker structure" or "rocker." The sensor principle of these rockers is based on a spring-mass system in which, in the simplest case, a movable asymmetrical seismic mass 40, which is implemented in functional layer P3 in FIGS. 1a and 1b, together with two evaluation electrodes 41, 42 which are fixed on the substrate at a distance $d_0$ and implemented in layer P1, forms two plate capacitors having capacitances C1 and C2. Seismic mass 40 is connected to the base or substrate 2 via at least one torsion spring 45 (for symmetry reasons, usually rather two torsion springs) with the aid of a suspension 46. Since the mass structures are different in size on the two sides of the torsion spring 45, the mass structure, during the action of a z acceleration, rotates relative to torsion spring 45 as the rotation axis. In this way, the distance of evaluation electrodes 41, 42 on the side including the larger mass fraction becomes smaller, and it becomes larger on the other side. The resulting capacitance change, which is typically differentially evaluated as C1-C2, is a measure of the acting acceleration. The movable structures and masses often include perforation holes. However, for the sake of clarity, the representation of perforation holes is dispensed with in all following figures.

As a result of increasing shock loads in a wide variety of applications, while simultaneously striving for miniaturization, the risk of adhesion increases, in which the movable mass 40 remains adhering to a mechanical fixed stop as soon as the adhesion forces in the stop are greater than the restoring forces of the spring-mass system. Such stops may be implemented to be fixed or resilient or also as a combination of a fixed stop with a resilient stop.

Figure 2:
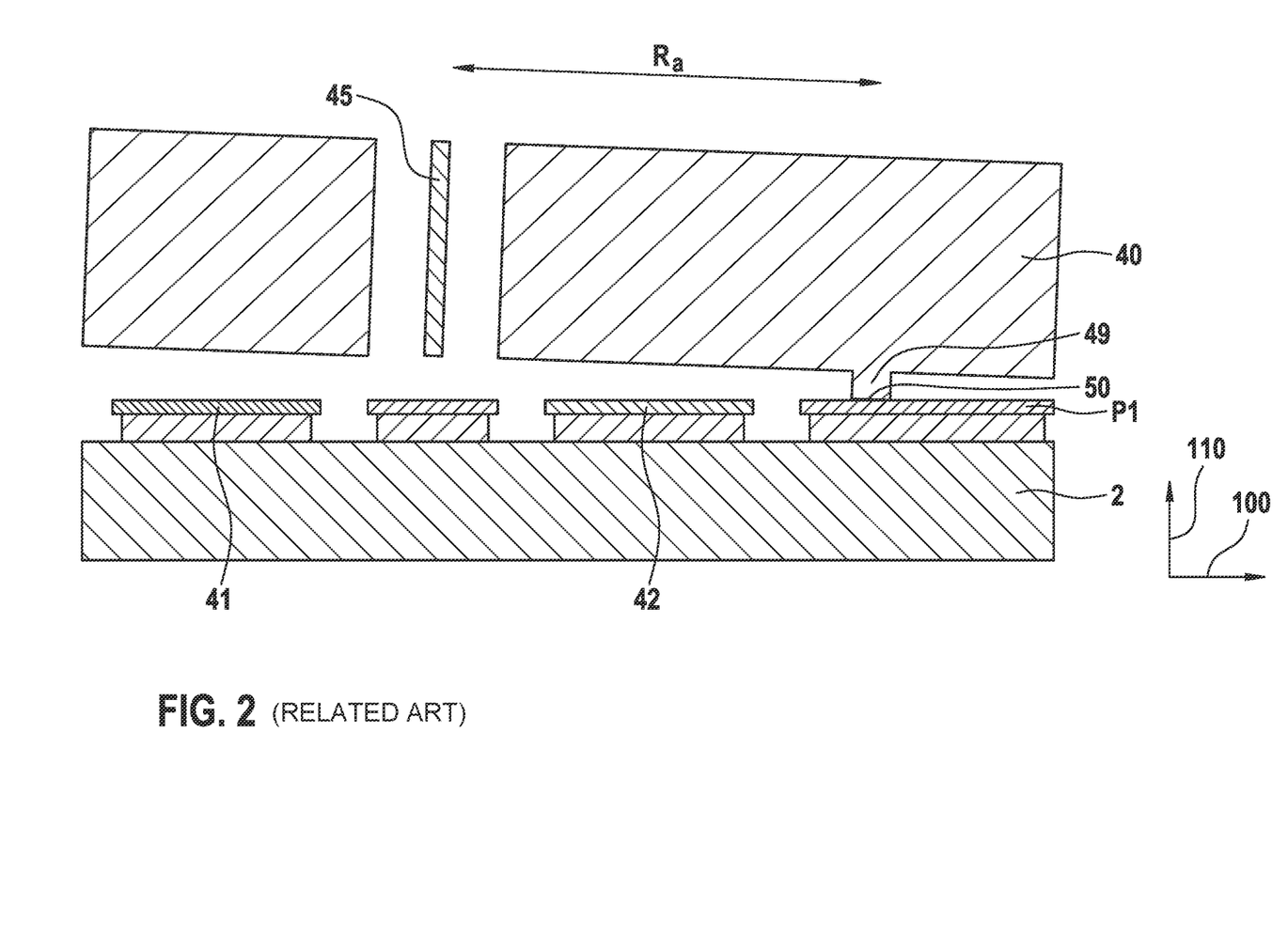

Based on the structure from FIGS. 1a and 1b, FIG. 2 shows a simple example of a fixed stop 49, which is situated in a knob form on the bottom side of seismic mass 40 and which, during a strong deflection of the rocker, strikes against the P1 layer, stop area 50 in the P1 layer having the same electrical potential as the movable structure. In this way, it is ensured that no electrical short circuits may arise, and additionally no large additional electrical forces are effective in the stop area, which could additionally increase the impact velocity of the sensor, and thus the adhesion risk. Under unfavorable circumstances, the sensor may adhere in the stop, namely when adhesion force $F_a$ in the knob stop is greater than restoring force Fr by torsion spring(s) 45, or, formulated alternatively with the aid of torques, when the adhesion torque, i.e., $F_a * R_a$, is greater than restoring torque $M_r = k_t * \alpha$, $R_a$ denoting the distance of stop knob 49 from torsion axis, $k_t$ denoting the torsional stiffness of the springs, and $\alpha$ denoting the deflection angle in the state of striking. Deflection angle $\alpha$ may also be expressed via basic distance $d_0$ and the knob distance from torsion axis $R_a$ with the aid of $\alpha = d_0/R_a$. To prevent adhesion, the following thus must apply:

$$k_t d_0/R_a > F_a R_a, \text{ or}$$

$$k_t > F a R_a^2/d_0.$$

The equation shows that, with a given adhesion force $F_a$ and a given basic distance $d_0$, it is advantageous to position stop knob 49 preferably close to the torsion axis. On the one hand, the rotation angle may thus be increased and, on the other hand, the lever arm for the adhesion forces may be reduced. Theoretically, a reduction in knob distance $R_a$ by a factor of 2 thus results in a reduction of the required torsional stiffness by a factor of 4. This is advantageous since softer springs result in a higher mechanical and electrical sensitivity of the sensor as well as enhanced immunity to substrate bending. In practice, however, stop knobs 49 may only be pulled so far to the torsion spring axis that a striking of the rocker against the outer edge is still reliably prevented, since stop knobs 49 would otherwise be ineffective; both the stop surface of the rocker and the adhesion torque would be considerably increased, so that the adhesion probability would be massively increased.

Figure 3:
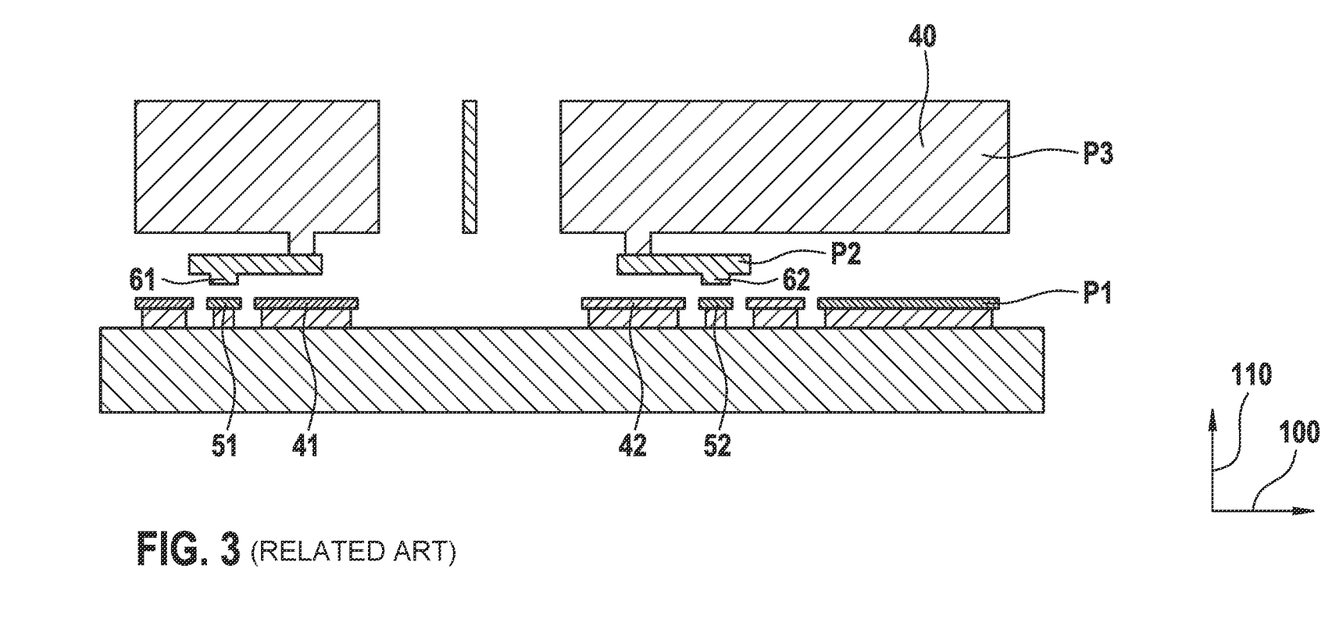

In the case of a combination of a resilient stop with a fixed stop, the resilient stop becomes effective first, during a strong deflection of the seismic mass, before the movable mass strikes against the fixed stop. The adhesion risk is thus reduced since the resilient stop is deflected slightly, and an additional restoring force is generated in the process. Moreover, the pulse transfer by the seismic mass is reduced as a result of the flexibility of the spring stop, so that the stop surfaces experience less damage. On the one hand, the abrasion of the ASC is thus reduced, and, on the other hand, the formation of very fine particles which may form with frequent striking is also reduced in this way. FIG. 3 shows a system according to FIG. 3 of German Patent Application No. DE 10 2012 207 939 A1 in a slightly modified, but synonymous representation. Resilient stops 61, 62 are implemented in level P2 and here act in the direction of fixed electrodes 41, 42 (bottom electrodes) formed in level P1, stop points 51, 52 (of layer P1) also in this case being kept potential-free with respect to movable mass 40.

Even though resilient stops, with appropriate dimensioning, contribute to an effective increase in the restoring force, adhesion remains a considerable challenge for the quality of MEMS, in particular, of acceleration sensors, and especially also of z acceleration sensors.

Figure 4:
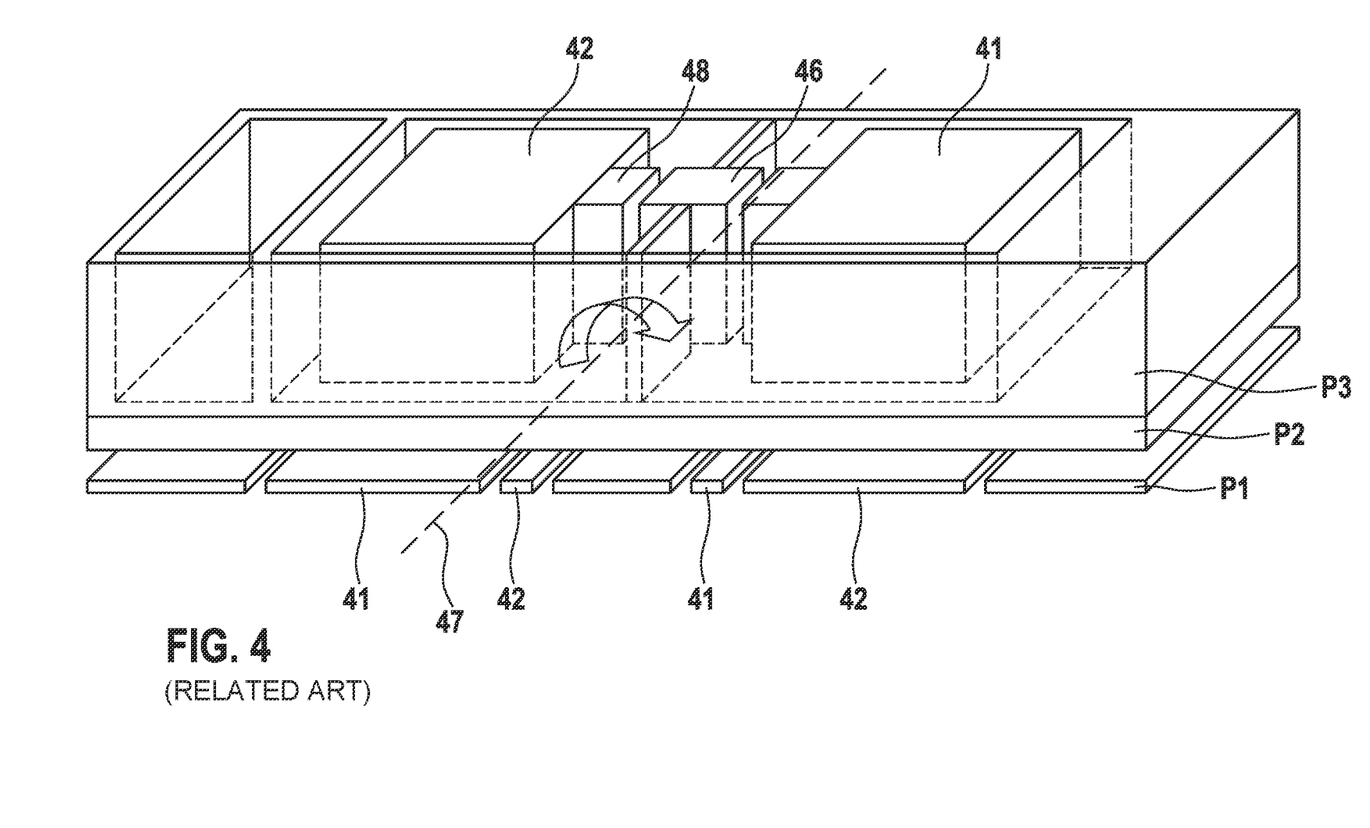
Figure 5A:
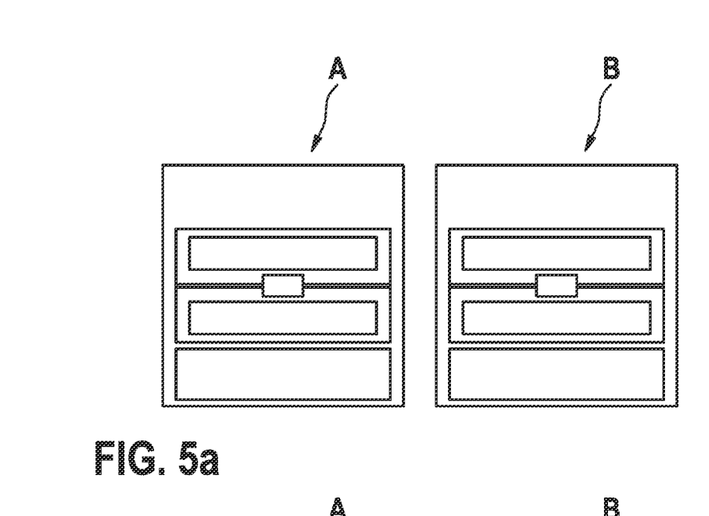
FIGS. 5a-5d show schematic representation of arrangements of dual cores to explain the present invention.
Figure 5B:
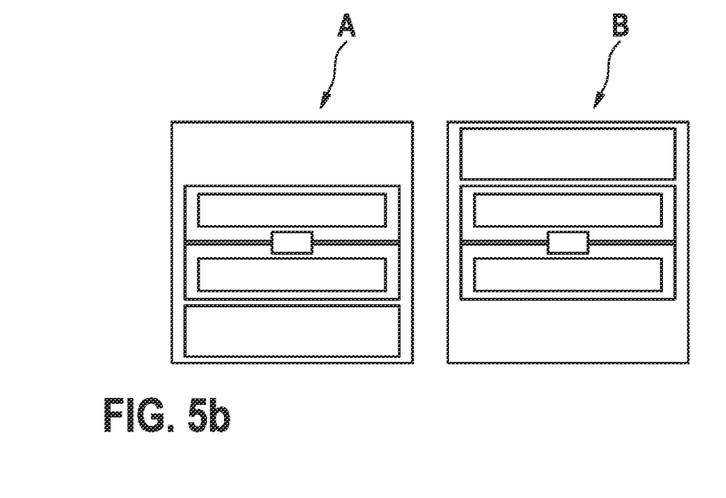
Figure 5C:
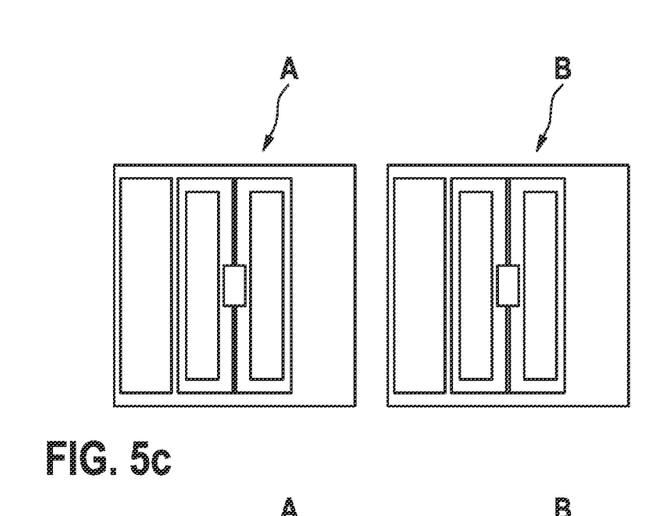
Figure 5D:
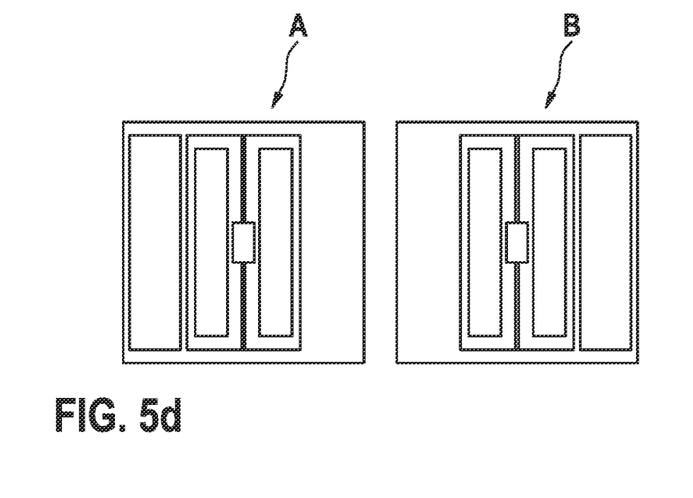
Figure 6A:
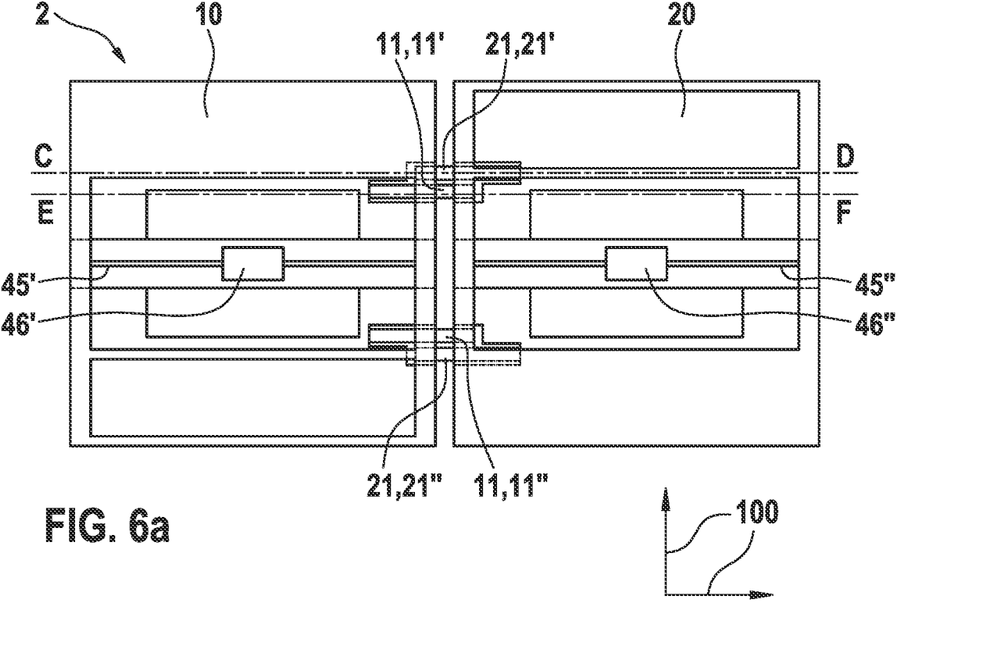
FIG. 6a-6d show a schematic representation of a sensor system according to one specific embodiment of the present invention.
Figure 6B:
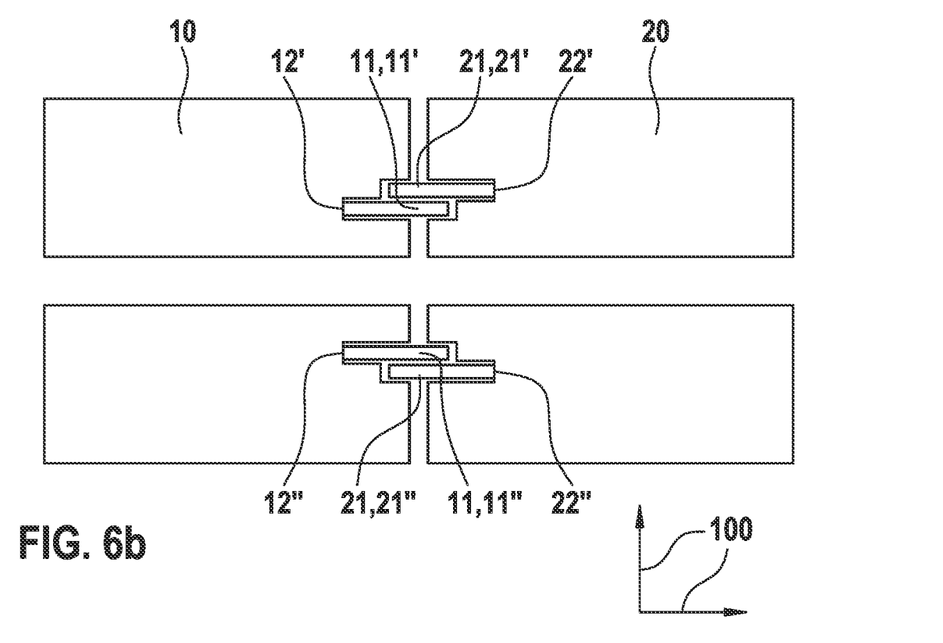
Figure 6C:
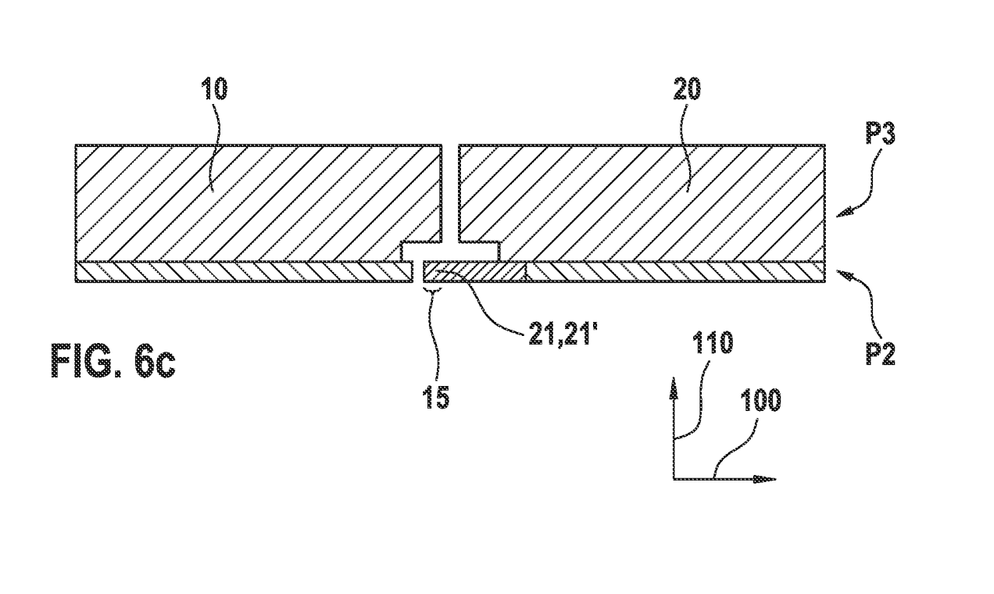
Figure 6D:
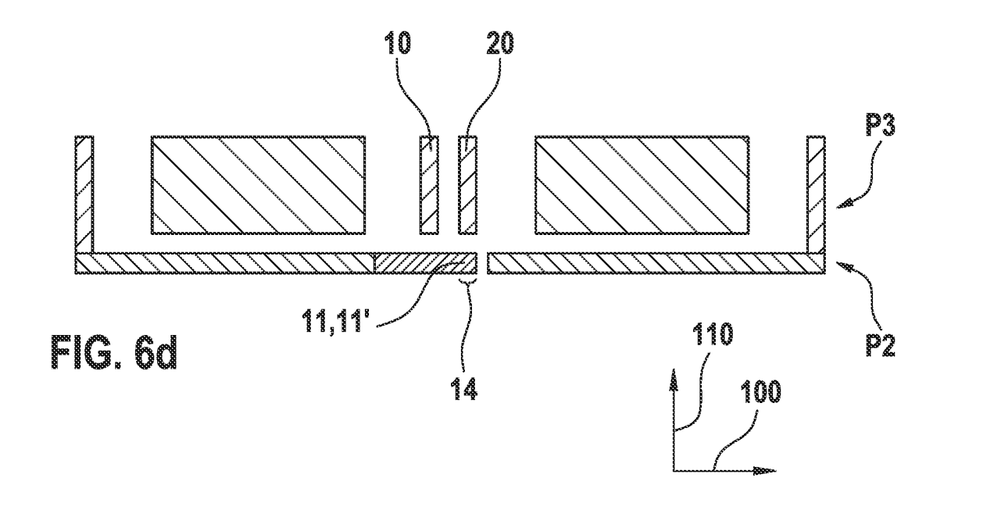
Figure 7A:
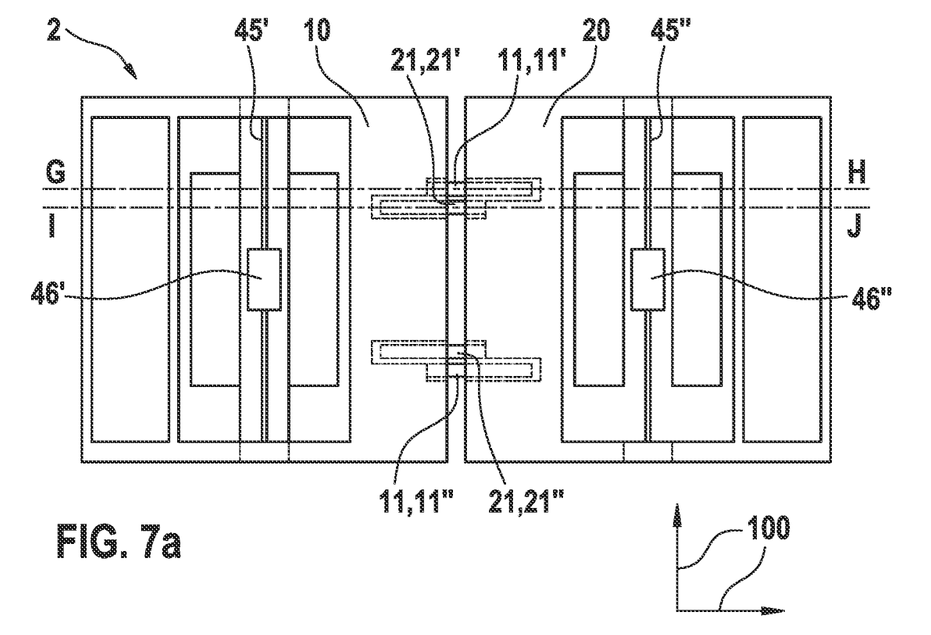
FIG. 7a-7d show a schematic representation of a sensor system according to one specific embodiment of the present invention.
Figure 7B:
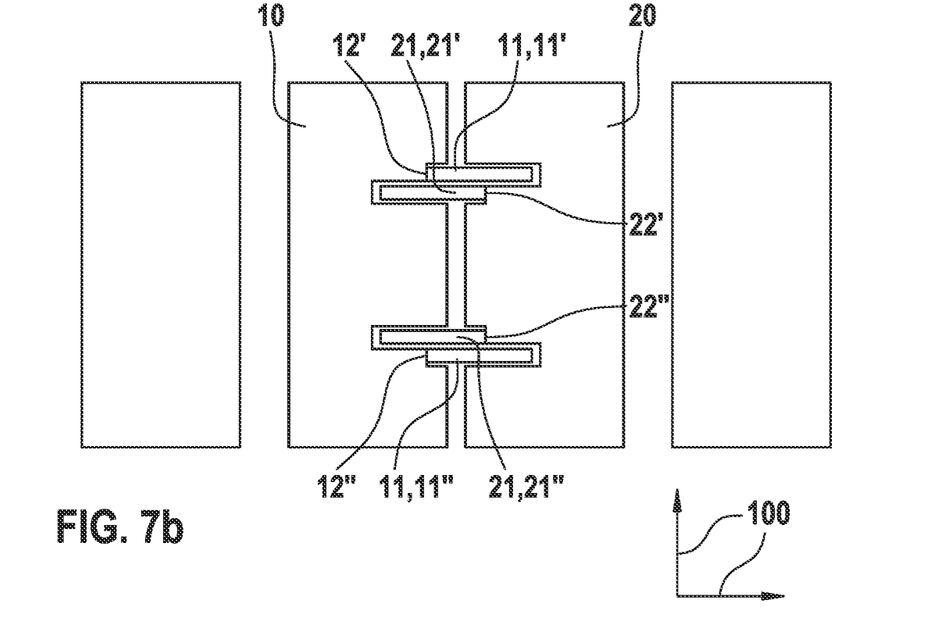
Figure 7C:
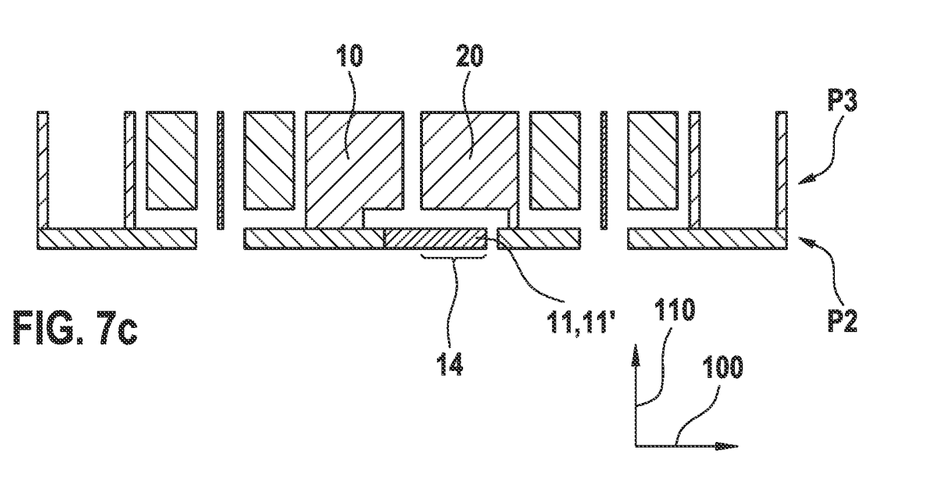
Figure 7D:
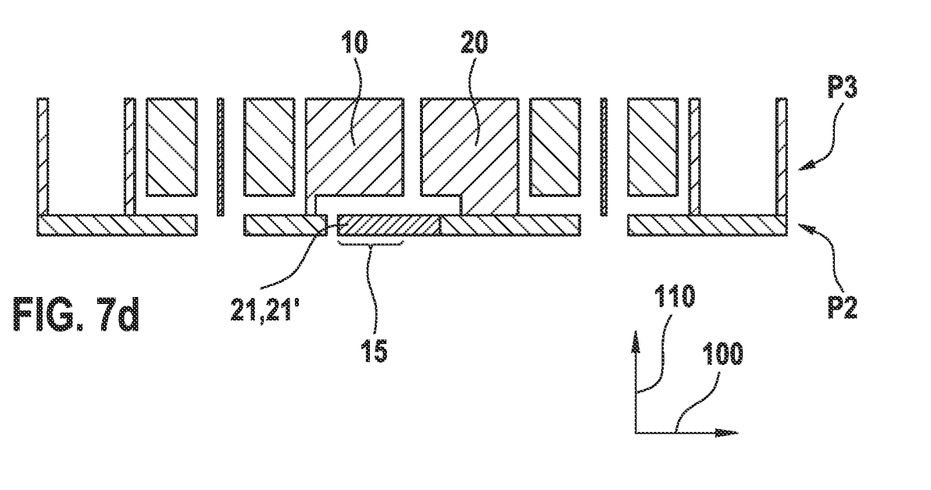

The two micromechanical layers P2, P3 for the movable structure or mass may be used not only for the implementation of resilient stops of a z acceleration sensor, but are above all used to enhance its performance. A corresponding concept is described in German Patent Application No. DE 10 2009 000 167 A1, in particular FIG. 8. FIG. 4 shows such a concept in a slightly modified form. In each case, first fixed electrodes 41 are electrically interconnected, and second fixed electrodes 42 are electrically interconnected. For example, first fixed electrodes 41 correspond to a capacitance C1, and second fixed electrodes 42 correspond to a capacitance C2. Difference signal C1-C2 is electrically evaluated. In particular, the top electrodes may be suspended via central suspensions 48. Mass 40 may be suspended via a central suspension 46 and rotate about torsion axis 47. This z sensor exhibits advantages over rocker structures which are only formed of a silicon functional layer P3 and a wiring layer P1. In particular, an increased capacitance density (i.e., capacitance/area) may be achieved since bottom (layer P1) and top electrodes (layer P3) are used. In this way, an improved signal-to-noise ratio may be achieved, with the same sensor surface (or else a reduced sensor surface, with the same noise performance), and a lower susceptibility to bending stress, since the top electrodes are centrally suspended, and the bottom electrodes (due to the additional capacitance formed by the top electrodes) may be implemented in a slightly more compact manner. Both aspects result in a lower offset and sensitivity drift during the occurrence of bending stress (e.g., due to circuit board bending or thermomechanical stress).

A further performance increase with respect to noise and offset may be achieved when two such z sensor cores A, B are situated next to one another. The sensor cores may be situated either shifted in parallel or rotated 180° (and, of course, additionally laterally shifted) with respect to one another. The electrical signals are then evaluated together as C_A1+C_B1−C_A2−C_B2. Possible arrangements of such dual rockers are shown in each case in FIGS. 5 a), b), c), and d) in a top view onto layer P3 to explain the present invention. One advantage of the dual arrangement is that the electrical sensitivity of the sensor is doubled as a result of the dual arrangement. In addition, the Brownian noise (caused by statistical impacts of the seismic mass with the gas particles in the sensor cavity) is also reduced by a factor √2~1.41 due to the statistical averaging of the two sensor cores. Both effects result in an improvement in the signal-to-noise ratio. Another advantage of the dual arrangement is that the sensitivity with respect to mechanical stress, which results in a bending of the sensor substrate, and thus in undesirable distance and capacitance changes at the evaluation electrodes, may be considerably reduced since, depending on the deformation field, the resulting capacitance changes at the evaluation electrodes may be entirely, or at least partially, compensated for with a skillful core arrangement. This results in an improvement in the offset stability. For example, the arrangements in which the sensor cores are situated rotated by 180° with respect to one another are suitable for this purpose (FIG. 5 b)). Furthermore, parasitic rocker deflections, which are caused by lateral temperature gradients in the chip and which would result in offset signals in a single rocker, may also be compensated for by skillful arrangements of two cores. In particular, the arrangements in which the two sensor cores are situated rotated by 180° with respect to one another are also suitable for this purpose (FIG. 5 b)).

FIGS. 6a-6d show a schematic representation of a sensor system 1 according to one specific embodiment of the present invention. Sensor system 1 is, in particular, a z acceleration sensor, i.e., an acceleration sensor for detecting accelerations in a vertical direction 110, perpendicular to main extension plane 100 of substrate 2 of sensor system 1. Sensor system 1 includes a first mass 10 and a second mass 20, which are each designed as rocker structures and thus are at least partially movable in vertical direction 110, perpendicular to main extension plane 100 of substrate 2. In the process, first mass 10 is suspended via a torsion spring 45' and a suspension 46'. The second mass is suspended via a further torsion spring 45" and a further suspension 46". First mass 10 includes a stop structure 11, and second mass 20 includes a stop structure 21. Stop structure 11 forms an overlap with second mass 20 in vertical direction 110. Further stop structure 21 forms an overlap with first mass 10 in vertical direction 110. The two sensor cores or masses 10, 20 are rotated relative to one another by 180°, as is also the case in the sensor shown in FIG. 5 b).

In addition to FIG. 5 b), FIG. 6 a) also shows the movable structures of the rockers or masses 10, 20 implemented in the P2 level. For the sake of clarity, in contrast, only the area of movable masses 10, 20 implemented in layer P2 are shown in FIG. 6 b). Stop structures 11, 21 are preferably each designed as part of masses 10 and 20 and are only highlighted for illustration reasons. Stop structure 11 is connected to the first sensor core or first mass 10 at connections 12', 12". The free end of stop structure 11 (or the free ends) protrudes into the area of the adjoining further sensor core of second mass 20. In the shown specific embodiment, stop structure 11 includes two resiliently designed beams 11', 11" or stop springs 11', 11", in each case, in the top view, one of beams 11', 11" being situated above and one being situated beneath the torsion spring axis of torsion spring 45' (FIG. 6 a)). Further stop structure 21 is connected to the second sensor core or second mass 20 at connections 22', 22". The free end of further stop structure 21 (or the free ends) protrudes into the area of the adjoining sensor core of first mass 10. In the shown specific embodiment, further stop structure 21 includes two resiliently designed beams 21', 21" or stop springs 21', 21", in each case, in the top view, one of beams 21', 21" being situated above and one being situated beneath the torsion spring axis of further torsion spring 45" (FIG. 6 a)).

Sub-FIGS. 6 c) and 6 d) show two cross sections. In the process, FIG. 6 c) shows the cross section along section planes C-D of FIG. 6 a), and FIG. 6 d) shows the cross section along section plane E-F of FIG. 6 a). Substrate 2 of the sensor and the P1 level are not shown for illustration reasons. Accordingly, only layer P2 and layer P3 are shown in each case.

It is shown in FIG. 6 c) that further stop structure 21 (or a stop spring 21' of further stop structure 21), which is connected to second mass 20, protrudes into the area of first mass 10 or of the first sensor core. In the process, further stop structure 21, in vertical direction 110, is partially situated between first mass 10 and substrate 2, which is not shown. In this way, a further overlap of further stop structure 21 with first mass 10 is formed in vertical direction 110. Accordingly, an overlapping area 15 results between further stop structure 21 and first mass 10 in a top view onto main extension plane 100. Due to overlapping area 15, contact of first mass 10 at stop spring 21' of second mass 20 may occur with sufficiently large vertical relative movements (for example during an overload event).

It is shown in FIG. 6 c) that stop structure 11 (or a stop spring 11' of stop structure 11), which is connected to first mass 10, protrudes into the area of second mass 20 or of the second sensor core. In the process, stop structure 11, in vertical direction 110, is partially situated between second mass 20 and substrate 2, which is not shown. In this way, an overlap of stop structure 11 with second mass 20 is formed in vertical direction 110. Accordingly, an overlapping area 14 results between stop structure 11 and second mass 20 in a top view onto main extension plane 100. Due to overlapping area 14, contact of second mass 20 at stop spring 11' of first mass 10 may occur with sufficiently large vertical relative movements in the opposite direction.

Due to the arrangement of masses 10, 20 rotated by 180° with respect to one another shown in FIG. 6, an out-of-phase movement of the two rockers or masses 10, 20 will occur during a z acceleration. Stop springs 11', 11", 21', 21" are positioned in such a way that no contact of the two masses 10, 20 at stop springs 11', 11", 21', 21" occurs within the normal measuring range of the sensor (low-level signal range). Masses 10, 20 thus then move completely independently of one another. In the event of an overload, i.e., a large z acceleration beyond the measuring range, in contrast, contact of the two masses 10, 20 at at least one of stop springs 11', 11", 21', 21" may occur, and in particular just before the rocker ends of masses 10, 20 or a possibly additionally present stop knob comes in contact with level P1. Due to stop structures 11, 21 according to the present invention (in this specific embodiment, due to stop springs 11', 11", 21', 21"), the restoring moments of torsion springs 45', 45" of both rockers or masses 10, 20 are advantageously effective in the event of the contact. Since the rockers move relative to one another, i.e., the relative angular deflection is twice as high as the angular deflection of each individual rocker, the stop distance from torsion axis $R_a$ may be selected to be considerably smaller than with a standard rocker. As was already represented, a reduction in the stop distance from the torsion axis may decisively contribute to the reduction of the adhesion risk.

In sum, a considerable increase in the robustness against overload, in particular, also against repeated overload (repetitive shock robustness), may be achieved.

Due to the arrangement of at least one stop spring 11', 11", 21', 21" per sensor core in each case, which each protrude into the adjoining core, it is furthermore possible to achieve the advantage that the contact between the two sensors may occur both during overload in the +z direction and in the −z direction (i.e., both during overload in vertical direction 110 and opposite to vertical direction 110).

In the specific embodiment shown in FIGS. 6a-6d, each of masses 10, 20 includes two overlapping stop springs 11', 11", 21', 21", one each (in the top view) above and beneath the torsion spring axis. However, as an alternative, it is also possible that stop structures 11, 21 of masses 10, 20 are in each case designed in such a way that they each include only one stop spring 11', 21'. As an alternative, further additional stop springs or other geometric configurations of stop structures 11, 21 are also possible. For example, as an alternative or in addition, rigid, non-resilient stop structures 11, 21 are also possible.

FIGS. 7a-7d show a schematic representation of a sensor system 1 according to one further specific embodiment of the present invention. The arrangement according to FIGS. 7a-7d is based on the basic arrangement according to FIG. 5 d). Masses 10, 20 or rockers are also rotated by 180° with respect to one another in this case, however in this specific embodiment are now laterally shifted perpendicular to their torsion spring axes of torsion springs 45', 45" so that the heavy rocker sides of masses 10, 20 are situated directly opposite one another. Overlapping stop structures 11, 21, in particular, stop springs 11', 11", 21', 21", are also implemented in this case. However, the function is different than in the specific embodiment shown in FIG. 6.

In particular, first mass 10 includes a stop structure 11, which includes two stop springs 11', 11", which each (in a top view onto main extension plane 100 of substrate 2) have an overlap with second mass 20. Second mass 20 includes a further stop structure 21, which includes two further stop springs 21, 21", which each (in the top view) have an overlap with first mass 10 (FIG. 7 a)). For the sake of clarity, FIG. 7 b) only shows the areas of movable masses 10, 20 implemented in layer P2 in a top view. FIGS. 7 c) and 7 d) show cross sections along section planes G-H (FIG. 7 c)) and I-J (FIG. 7 d)).

In the specific embodiment according to FIGS. 7a-7d, the two rocking masses 10, 20 move in phase when z accelerations occur. As a result, theoretically no relative movement occurs, and thus also no contact of the two masses 10, 20, even during overload. The two masses 10, 20 may include dedicated additional stops, which are conventional, or dedicated additional stop knobs and/or resilient stops within the particular host sensor core (not shown). If adhesion of one of the sensor cores or masses 10, 20 occurs at one of these stops, the other sensor core will only with a very low probability also experience the adhesive state since the adhesion is a phenomenon with a highly statistical component. The non-adhering mass 10, 20 will thus swing back into the idle state after the overload event. In the process, depending on the dimensioning of the overlapping stop springs 11', 11", 21', 21", contact of the two masses 10, 20 may already occur at one or multiple of stop springs 11', 11", 21', 21", so that torsion spring 45', 45" of the non-adhering mass 10, 20 provides an additional restoring force for the adhering mass 10, 20, and thus an increased probability exists that the adhering mass 10, 20 becomes freely movable again. Even if the dimensioning of the overlapping stop springs 11', 11", 21', 21" is such that no contact occurs yet between masses 10, 20 during a mere swing back into the idle state, the non-adhering mass 10, 20 may deflect in the opposite direction during a subsequent overload event. At the latest, contact between masses 10, 20 thus occurs at one or multiple of overlapping stop springs 11', 11", 21', 21". The non-adhering mass 10, 20 may thus knock the adhering mass 10, 20 loose again during a subsequent impact due to the brief, but very strong pulse transfer, and free it from the adhesive state. In this case, the arrangement is thus used less to prevent the adhesion of an individual rocker, but to knock or shake it loose after an adhesion event occurs.

In the arrangements of FIGS. 6a-6d and 7a-7d, masses 10, 20 are almost not changed by the overlapping stop springs 11', 11", 21', 21", so that neither the static (offset, sensitivity) nor the dynamic behavior (frequency, damping) of the sensor is influenced to a noteworthy degree. The overlapping stop springs 11', 11", 21', 21" thus only have the described advantageous influence on the robustness of the sensor during overload, and have almost no influence on the free oscillating behavior.

In the specific embodiments of FIGS. 6a-6d and 7a-7d, masses 10, 20 are each designed as rockers. According to the present invention, however, masses 10, 20 may alternatively also have different configurations. Stop structures 11, 21 according to specific embodiments of the present invention may be used not only for z rockers, but, for example, also for trampoline-like z acceleration sensors, which are implemented as dual cores. In such a specific embodiment, masses 10, 20 are each designed in a trampoline-like manner, for example. Trampoline-like z acceleration sensors carry out a purely translatory z movement in vertical direction 110. In a simple example, in a dual core arrangement, the trampoline-like masses 10, 20 of the two individual cores move in phase, so that the function of stop structures 11, 21 (for example, including overlapping stop springs 11', 11", 21', 21") corresponds to the function according to FIGS. 7a-7d. In this case, the contact at stop structures 11, 21 thus typically also only occurs after one of masses 10, 20 strikes against a stop within the host sensor core surface and has possibly experienced an adhesive state. The still movable mass 10, 20 is then able to knock the adhering mass 10, 20 loose again, in particular, during a subsequent shock event.

In the specific embodiments according to FIGS. 6a-6d and 7a-7d, stop structures 11, 21 are each formed in layer P2. However, as an alternative, it is also possible to implement stop structures 11, 21 in layer P3, or partially in layer P2 and partially in layer P3.

In the specific embodiments according to FIGS. 6a-6d and 7a-7d, stop structures 11, 21 each include stop springs 11', 11", 21', 21". However, as an alternative, it is also possible that stop structures 11, 21 are designed to be very stiff or rigid, i.e., non-resilient. However, care must be taken regarding the mechanical robustness in the process. In particular, overlapping stop structures 11, 21 implemented in the comparatively thin layer P2 could otherwise be knocked off the stiff P3 structures during high overload.

Figure 8:
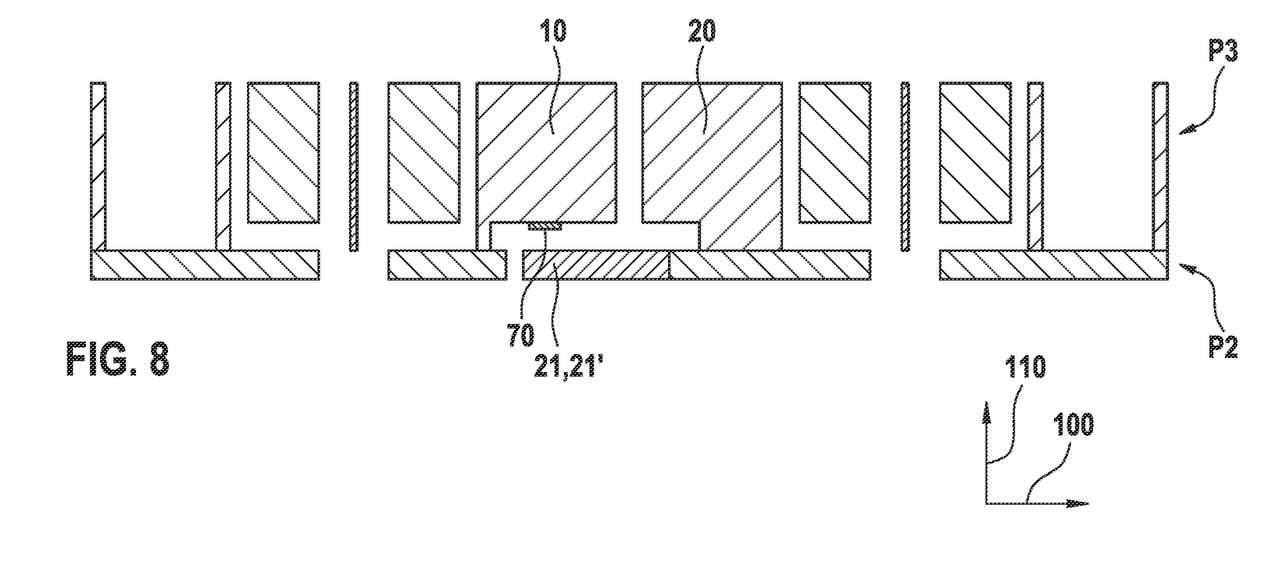
FIG. 8 show a schematic representation of a sensor system according to one specific embodiment of the present invention.

In the specific embodiments according to FIGS. 6a-6d and 7a-7d, no contact elements 70, in particular, protrusions or stop knobs, are shown on the bottom side of masses 10, 20 in layer P3 in the contact area with stop structures 11, 21. However, it is possible that such additional contact elements 70 are implemented on the bottom side of masses 10, 20. For this purpose, (an additional level) may be implemented in the processing, for example. With the aid of such additional contact elements 70, the contact surface at the stop may be kept very small and defined. A corresponding arrangement is shown by way of example in FIG. 8 (based on the arrangement according to FIG. 7 d)). The shown further contact element 70 is situated at first mass 10 in the process. During or after an overload case of the sensor system, a contact between first mass 10 and second mass 20 is established via further contact element 70 and further stop structure 21. In addition or as an alternative, a contact element may be situated at second mass 20, which comes in contact with stop structure 11 during or after an overload case (not shown).

What is claimed is:

1. A micromechanical sensor system, comprising:
a substrate having a main extension plane; and
a first mass and a second mass, the first and second masses each being configured to be at least partially movable in a vertical direction, perpendicular to the main extension plane of the substrate, the first mass including a stop structure which includes two stop springs, wherein each of the two stop springs of the stop structure has an overlap with the second mass in the vertical direction,
wherein the second mass includes a further stop structure which includes two further stop springs, wherein each of the two further stop springs of the further stop structure has a further overlap with the first mass in the vertical direction,
wherein the first mass is configured to come in mechanical contact with an overlapping section of the further stop structure in the vertical direction, and the second mass is configured to come in mechanical contact with an overlapping section of the stop structure in the vertical direction.

2. The micromechanical sensor system as recited in claim 1, wherein the micromechanical sensor system is an acceleration sensor.

3. The micromechanical sensor system as recited in claim 1, wherein the overlap of the stop structure with the second mass in the vertical direction is formed in that the stop structure, in the vertical direction, is at least partially situated between the second mass and the substrate.

4. The micromechanical sensor system as recited in claim 1, wherein the further overlap of the further stop structure with the first mass in the vertical direction is formed in that the further stop structure, in the vertical direction, is at least partially situated between the first mass and the substrate.

5. The micromechanical sensor system as recited in claim 1, wherein the sensor system is configured in such a way that a contact is formed between the stop structure and the second mass in an overload case of the sensor system, the sensor system being configured in such a way that a contact is formed between the further stop structure and the first mass in the overload case of the sensor system.

6. The micromechanical sensor system as recited in claim 1, wherein the stop structure is resilient, and the further stop structure is resilient.

7. The micromechanical sensor system as recited in claim 1, wherein the second mass includes a contact element, the contact element being a knob, the contact element being situated in such a way that, in and/or after an overload case of the sensor system, a contact between the first mass and the second mass is established via the contact element and the stop structure, the first mass including a further contact element, the further contact element being a further knob, the further contact element being situated in such a way that, in and/or after the overload case of the sensor system, a contact between the first mass and the second mass is established via the further contact element and the further stop structure.

8. A method for using a micromechanical sensor system for measuring a measuring variable, the method comprising:
providing the micromechanical sensor system, the micromechanical system including:
a substrate having a main extension plane, and
a first mass and a second mass, the first and second masses each being configured to be at least partially movable in a vertical direction, perpendicular to the main extension plane of the substrate, the first mass including a stop structure which includes two stop springs, wherein each of the two stop springs of the stop structure has an overlap with the second mass in the vertical direction; and measuring an acceleration using the micromechanical sensor system, wherein the second mass includes a further stop structure which includes two further stop springs, wherein each of the two further stop springs of the further stop structure has a further overlap with the first mass in the vertical direction, a contact being formed between the further stop structure and the first mass in the overload case of the sensor system such that the first mass is configured to come in mechanical contact with an overlapping section of the further stop structure in the vertical direction, and the second mass is configured to come in mechanical contact with an overlapping section of the stop structure in the vertical direction.

9. The method as recited in claim 8, wherein a contact is formed between the stop structure and the second mass in an overload case of the sensor system.

10. The method as recited in claim 8, wherein, in the overload case of the sensor system, the contact is formed between the stop structure and the second mass before the second mass and/or the first mass comes in contact with a further structure of the sensor system, in the overload case of the sensor system the contact is formed between the further stop structure and the first mass before the first mass and/or the second mass comes in contact with the further structure of the sensor system.

\* \* \* \* \*